United States Patent [19]

Kupfer

[11] Patent Number: 4,667,167
[45] Date of Patent: May 19, 1987

[54] CIRCUIT FOR AUTOMATIC GAIN CONTROL

[75] Inventor: Karl-Heinz Kupfer, Krefeld, Fed. Rep. of Germany

[73] Assignee: U.S. Philips Corporation, New York, N.Y.

[21] Appl. No.: 819,573

[22] Filed: Jan. 17, 1986

[30] Foreign Application Priority Data

Jan. 25, 1985 [DE] Fed. Rep. of Germany ....... 3502422

[51] Int. Cl.⁴ .............................................. H03G 3/30
[52] U.S. Cl. .................................... 330/281; 330/141; 330/284; 360/67; 360/68
[58] Field of Search ............... 330/134, 144, 145, 149, 330/141, 281, 284; 360/67, 68; 455/244, 246, 249

[56] References Cited

U.S. PATENT DOCUMENTS 3,790,896  2/1974  Shimizu et al. ..................... 330/281

FOREIGN PATENT DOCUMENTS 3027715  2/1982  Fed. Rep. of Germany ...... 330/281

Primary Examiner—James B. Mullins
Attorney, Agent, or Firm—Edward W. Goodman; William J. Streeter; Anne E. Barschall

[57] ABSTRACT

The invention relates to an automatic gain control circuit, preferably in magnetic recording and/or reproducing equipment, having a first input (1) and a second input (3). The impedance at output (5) of the automatic gain control circuit, when activated, is reduced to control the levels of the signals applied to the first input (1) and the second input (3), which impedance reduction in the case of actuation in response to signals applied to the first input is effected with a smaller time constant than in the case of actuation in response to signals applied to the second input. An audio signal without high frequency pre-emphasis is applied to the first input (1) and the same signal with high-frequency pre-emphasis is applied to the second input.

5 Claims, 2 Drawing Figures

CIRCUIT FOR AUTOMATIC GAIN CONTROL

BACKGROUND OF THE INVENTION

The invention relates to a circuit for automatic gain control.

In communication technology it is frequently required to control audio signals, for example speech or music signals so as to maintain them at a substantially constant level. This process is generally referred to as gain control. In particular in the field of entertainment electronics, it is desirable, mainly for reasons of convenience, to have automatic gain control without the intervention of the user. Automatic gain control circuits are employed in practically all video recorders and in many compact-cassette recorders. The basic problem in automatic gain control systems is that on the one hand gaturation of the tape should be avoided and on the other hand the systems should not be too sensitive to individual pulses.

DE-OS No. 30 27 715 describes a circuit for automatically controlling or limiting of the dynamic range in which the emphasis is put on a fast response of the control system. This circuit comprises two inputs through each of which a capacitor is charged. The time constants are selected in such a way that the charging-time constant and the discharge-time constant of the first capacitor are very small and those of the second capacitor are significantly larger. However, in particular in the case of peak rectification of the signal this leads to an oversensitivity to brief high-frequency signal components. This means that in the case of such signal components the control system reduces the audio signal considerably and subsequently increases this signal too slowly, which sounds annoying. This "flutter" effect results in a very unsteady sound impression. Generally, this becomes even worse when a noise-reduction circuit is used.

Further, DE-OS No. 23 01 281 describes an automatic gain control circuit by means of which it is attempted to overcome this problem by the use of two control inputs with different response times and different recovery times. For example, in the case of signal components or noise of short duration the recovery time should be small. However, this leads to the above-mentioned fluttering and unsteady sound impression, in particular if the control circuit is so arranged in a recording amplifier that it receives the pre-emphasized audio signal. However, if it is so arranged in the recording amplifier branch that it receives the signal without pre-emphasis, this results in the treble tones being distorted because the control circuit processes these tones in the same way as the mid-range tones and the bass-tones. No allowance is then made for the fact that the treble tones are pre-emphasized after the gain control.

SUMMARY OF THE INVENTION

It is the object of the invention to provide an automatic gain control circuit which is capable of controlling an audio signal so as to maintain a substantially constant output level, allowance being made for the pre-emphasis, and which is not too sensitive to brief high-frequency signal components.

In accordance with the invention this object is achieved by connecting an output of an amplifier having a linear frequency response is coupled to the first input of the circuit. An input of the amplifier is coupled to the output of the circuit, and an output of a further amplifier which is connected to an RC-circuit for boosting the level of signal components of a higher frequency is coupled to the output of the first amplifier. The output of the further amplifier is coupled to the second input of the circuit.

This automatic gain-control circuit comprises a first input with a short response time, to which input the linear audio signal is applied and which provides most of the automatic gain control. Since the signal has not yet been pre-emphasized the response to short high-frequency signal components will not be excessive. Therefore, the control action will not affect the sound impression. In order to allow for the pre-emphasis the circuit comprises a second input with a longer response time, which input receives the pre-emphasized audio signal. In this way the automatic gain control allows for the higher frequencies in the audio signal including the pre-emphasis, but does not respond to incidental brief high-frequency signal components. This gives a substantially steady and more balanced sound impression.

In a second embodiment of the invention, which is based on the same principle, the signal applied to the second input (3) is passed through the recording section or the playback section of a noise-reduction system.

Since the audio signal without pre-emphasis is applied to the first input having a smaller response time constant, it is possible to reduce the response time constant even further and, in addition, to reduce the recovery time constant without the risk of the gain control responding to individual brief high-frequency components by excessively reducing their level.

In a further embodiment of the invention the audio signal applied to the second input is additionally passed through the recording or playback section of a noise-reduction system.

Practically all conventional noise-reduction systems provide an additional treble boost of up to approximately 20 dB in the recording section. The above-mentioned advantages of the circuit for automatic gain control in accordance with the invention then become even more apparent, because also in this configuration a steady control behaviour is guaranteed even for short high-frequency signal components whose level has been boosted by, for example, 30 dB.

Embodiments of the invention will now be described in more detail, by way of example, with reference to the accompanying drawing.

DESCRIPTION OF THE PREFERRED EMBODIMENT

Figure 1:
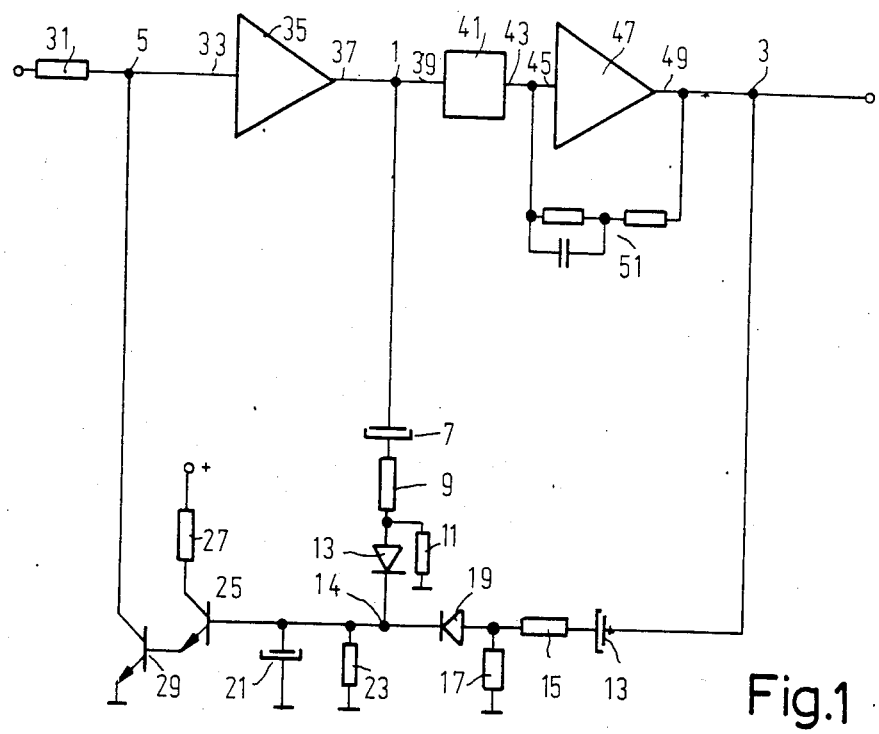
FIG. 1 shows a first automatic gain control circuit in accordance with the invention.

The lower part of FIG. 1 shows a circuit arrangement for automatic gain control, comprising a first input 1, a second input 3 and an output 5. A capacitor 7, a resistor 9 and a further resistor 11, which is connected to earth, are arranged in series with the first input 1. A diode 13 is arranged between the junction point of the resistors 9 and 11 and a node 14, to which it is connected by its cathode. A capacitor 13, a first resistor 15 and a second resistor 17, which is connected to earth, are arranged in series with the second input 3. In the same way the junction point between the two resistors is connected to the node 14 through a diode. Further the node 14 is connected to a capacitor 21, a resistor 23, both connected to earth, and the base of a transistor 25, whose collector is connected to the power supply through a resistor 27 and whose emitter is connected to the base of a further transistor 29, whose base is connected to earth and whose collector constitutes the output 5.

The automatic gain control circuit may be connected to a recording amplifier, for example in the following manner. The audio signal to be recorded is applied, by a resistor 31, both to the output 5 of the gain control circuit and to an input of first amplifier 35. The output 37 of this amplifier is connected both to the first input of the gain control circuit and to the input 39 of a noise-reduction circuit 41. The output 43 of this circuit is connected to the input 45 of a second amplifier 47 whose output 49 is fed back to its input 45 through an RC circuit 51 for pre-emphasis (treble boost) of the audio signal. Further, the output 49 of the second amplifier 47 is connected to the second input 3 of the gain control circuit. This output 49 of the second amplifier stage thus supplies the signal which has been controlled by the automatic gain control to ensure that it has a specific level which in addition has been pre-emphasized and has also been passed through the recording section of a noise-reduction circuit, if present.

The response-time constant of the first input depends on the values of the capacitor 7 and 21 and the resistor 9, that of the second input by the values of the capacitors 13 and 21 and the resistor 15. The diodes 13 and 19 serve for rectification. As the capacitor 21 is charged both by the signal on the first input 1 and that on the second input 3 the recovery-time constants of both inputs are the same. The recovery-time constant depends on the values of the capacitor 21 and the resistor 23. When the capacitor 21 is charged to such a value that the voltage on the base of the transistor 25 exceeds the threshold voltage the transistors 25 and 29 are turned on. This output-resistance variation of the transistors 29 controls the audio signal which is applied to the input 33 of the amplifier 35 through the resistor 31.

Figure 2:
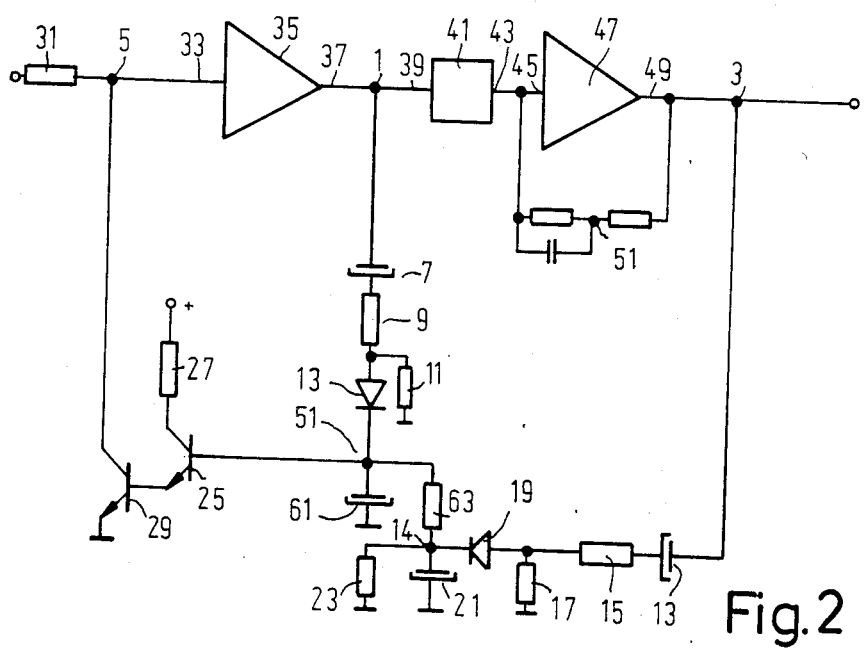
FIG. 2 shows a second automatic gain control circuit in accordance with the invention.

The second embodiment of the invention shown in FIG. 2 also comprises two inputs 1 and 3 whose input circuits, which each comprise a capacitor, two resistors and a diode, are arranged in the same way as in the first embodiment of the invention shown in FIG. 1. The cathode of the diode 13 of the first input 1 is connected to a node 51. This node 51 is connected to earth by a capacitor 61 and to the node 14 through a resistor 63, which mode 14, as in the embodiment shown in FIG. 1, is connected to earth through a resistor 23 and a capacitor 21. Further the node 51 is connected to the base of the transistor 25, which like the transistor 29 is further arranged in a similar way as in the embodiment shown in FIG. 1. In this second embodiment signals applied to the input 3 of the circuit charge only the capacitor 21. Signals applied to the input 1 charge both the capacitor 61, by the resistor 63, and the capacitor 21. The time constants are selected in such a way that the capacitor 61 is charged and discharged substantially faster. This means that the gain control responds slowly in conformity with the time constant obtaining for the capacitor 21, which practically ensures that the control process cannot become audible. Nevertheless, incidental pulses can be eliminated rapidly because they charge the capacitor 61 rapidly. As the capacitor 61 is charged more frequently the capacitor 21 is also charged through the resistor 63 to adapt the gain slowly to the new level.

The automatic gain control circuit, in both embodiments of the invention, provides such a control that a very steady sound impression is obtained with short response times, the circuit being particularly advantageous in equipment comprising an additional noise reduction circuit.

The embodiments shown in FIGS. 1 and 2 are adapted for use in the recording section of a magnetic-tape apparatus. The circuit for the playback section is identical, but now the playback signal is not taken from the input 3 of the circuit but from the input 45 of the amplifier 47, because in this case the treble boost provided by the network 51 is no longer required. If in the case of noise-reduction systems which operate symmetrically for recording and playback in the same way as in FIGS. 1 and 2 the recording section 41 of such a noise-reduction circuit in accordance with FIGS. 1 and 2 is used, the control circuit in the playback section should be identical to each having the same time constants as the control circuit in the recording section in order to ensure a correct operation of the noise-reduction circuit. The playback section of the noise-reduction circuit is arranged in the same way as the recording section. The playback signal is then taken from the output of the noise-reduction circuit.

What is claimed is:
1. An automatic gain control circuit comprising: a first amplifier with a linear frequency response having an input for receiving a signal to be amplitude controlled and an output;
a second amplifier having an input connected to said first amplifier output, and an output, said second amplifier including an RC pre-emphasis circuit for increasing the signal level of higher frequency components in a received signal;
a first signal path connected to said first amplifier output;
a second signal path connected to said second amplifier output having a response time constant greater than said first signal path response time constant;
means for combining signals from said first and second signal paths into a control voltage; and
means for varying the impedance at said first amplifier input in proportion to said control voltage, whereby a substantially constant output signal is produced from said second amplifier having reduced sensitivity to brief high frequency signal components.

2. The automatic gain control circuit of claim 1 further comprising a noise reduction system connected between said first amplifier output and second amplifier input.

3. A circuit as claimed in claim 1, wherein after actuation of the circuit the impedance increases with a recovery-time constant which is independent of the signal path which actuated the impedance variation.

4. A circuit as claimed in claim 3 wherein signals from each signal path charges a common charging capacitor, the voltage across said capacitor controlling the impedance at said first amplifier input.

5. A circuit as claimed in claim 1, wherein the signals from said first signal path charge a first charging capacitor and a second charging capacitor and the signals from said second signal path charge only the second charging capacitor the charging-time constant of the first capacitor being smaller than that of the second capacitor, and in that the voltage across the parallel arrangement of the first capacitor with series arrangement of the second capacitor and a resistor controls the impedance at said first amplifier input.

* * * * *